United States Patent [19]

Youmans

[11] 3,918,079

[45] Nov. 4, 1975

[54] ENCAPSULATED BEAM LEAD CONSTRUCTION FOR SEMICONDUCTOR DEVICE AND ASSEMBLY AND METHOD

[75] Inventor: Albert P. Youmans, Cupertino, Calif.

[73] Assignee: Signetics Corporation, Sunnyvale, Calif.

[22] Filed: May 31, 1974

[21] Appl. No.: 475,127

Related U.S. Application Data

[63] Continuation of Ser. No. 108,972, Jan. 22, 1971, abandoned, which is a continuation of Ser. No. 748,070, July 26, 1968, abandoned.

[52] U.S. Cl. .................... 357/49; 357/55; 357/69; 357/72;

[51] Int. Cl.[2] .................... H01L 27/12; H01L 29/06; H01L 29/52 H01L/23/28

[58] Field of Search .................... 357/49, 55, 69, 72

[56] References Cited

UNITED STATES PATENTS

| | | | |
|---|---|---|---|
| 3,335,338 | 8/1967 | Lepselter | 357/49 |
| 3,496,333 | 2/1970 | Alexander et al. | 357/49 |

*Primary Examiner*—Michael J. Lynch
*Assistant Examiner*—E. Wojciechowicz
*Attorney, Agent, or Firm*—Flehr, Hohbach, Test, Albritton & Herbert

[57] ABSTRACT

Semiconductor device and assembly having a beam lead construction with oxide encapsulation and with either junction, air or dielectric isolation for isolating the devices from each other, and a method for making the same.

12 Claims, 30 Drawing Figures

INVENTOR.
Albert P. Youmans
BY Flehr, Hohbach, Test, Albritton & Herbert
Attorneys

INVENTOR.

Albert P. Youmans

BY Flehr, Hohbach, Test, Albritton & Herbert

Attornevs

INVENTOR.

Albert P. Youmans

BY Flehr, Hohbach, Test, Albritton & Herbert

Attorneys

INVENTOR.
Albert P. Youmans
BY Flehr, Hohbach, Test, Albritton & Herbert
Attorneys INVENTOR.
Albert P. Youmans
BY Flehr, Hohbach, Test, Albritton & Herbert
Attorneys INVENTOR.
Albert P. Youmans
BY Flehr, Hohbach, Test, Albritton & Herbert
Attorneys INVENTOR.
Albert P. Youmans
BY Flehr, Hohbach, Test, Albritton & Herbert
Attorneys

ENCAPSULATED BEAM LEAD CONSTRUCTION FOR SEMICONDUCTOR DEVICE AND ASSEMBLY AND METHOD

This is a continuation, of application Ser. No. 108,972 filed Jan. 22, 1971, and now abandoned, which is a continuation of Ser. No. 748,070 filed July 26, 1968, now abandoned.

BACKGROUND OF THE INVENTION

As described by the Bell Laboratories Record for October/November 1966, there has been developed by Bell Telephone Laboratories, Inc. a beam lead technology for use with semiconductor devices and integrated circuits. It has been found that with the production of semiconductor devices and integrated circuits utilizing this technology that the individual devices are separated by air and that the beam leads which are utilized overhang the edge of the silicon substrate or body in which the devices are formed. The body is exposed to the atmosphere and to moisture. In order to prevent breakdown between the portions of the leads which overhang the body, it has been the practice to cut back the silicon by etching so that the silicon substrate underhangs the thin insulating layer which overlies the substrate. Even with such a construction, it has been found that shorts still occur, particularly, when the beam leads are bonded to a lead pattern carried by another substrate. It has been found that very often during the bonding the metal is extruded back towards the substrate and occasionally this will break the layer of insulating material overlying the substrate or that the lead will force itself in a direction towards the silicon body so that the lead contacts the bare silicon to make possible a short.

SUMMARY OF THE INVENTION AND OBJECTS

The semiconductor assembly consists of a body of semiconductor material which has a planar surface. At least one active device is formed in the body by junctions which extend to the surface. Leads are carried by the body and make contact with the active device. The leads are formed so that they extend beyond the extremities of the body. A layer of insulating material encapsulates the body and makes contact with portions of the leads which overhang the body and which are in closest proximity to the body. The body of semiconductor material with the layer of insulating material thereon is surrounded by air. When a plurality of the devices are utilized, they are interconnected by leads but are otherwise separated from each other electrically by air. The method for constructing such devices is applicable to junction, air and dielectrically isolated devices.

In general, it is an object of the present invention to provide a semiconductor device and assembly which utilizes a beam lead construction in which the body of each semiconductor device carrying the circuit element or elements is encapsulated.

Another object of the invention is to provide a semiconductor device and assembly of the above character in which the circuit elements in the semiconductor device can be junction, air or dielectrically isolated.

Another object of the invention is to provide a method for making a semiconductor device and assembly in which the body of each semiconductor device carrying the circuit element or elements is encapsulated in a layer of insulating material and in which air isolation is utilized for isolating one device from another.

Another object of the invention is to provide a method of the above character for making junction, air or dielectrically isolated devices.

Additional objects and features of the invention will appear from the following description in which the preferred embodiments are set forth in detail in conjunction with the accompanying drawing.

DESCRIPTION OF THE PREFERRED EMBODIMENT

In FIGS. 1 through 6 there is shown a method for making a semiconductor device and assembly incorporating the present invention in which junction isolation is utilized for electrically separating or isolating the circuit elements from each other. The semiconductor device and/or assembly is formed by first taking a semiconductor body 11 of a suitable type such as a slice or wafer of a single crystal or mono-crystalline silicon. The body 11 can be either of pure silicon or it can be doped to provide either N or P type conductivity depending upon the type of active devices desired and the type of semiconductor assembly being constructed. Thus, as shown, the body 11 can be doped to provide a P-type conductivity. The body is provided with spaced parallel upper and lower surfaces 12 and 13. Both surfaces are ground flat to very close tolerances.

Figure 1:
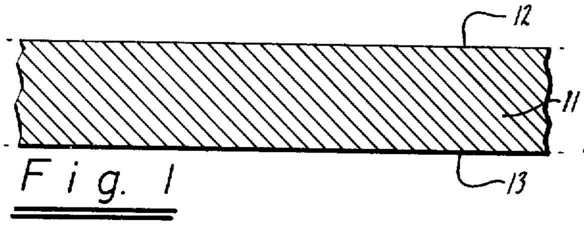
FIGS. 1 through 6 are cross-sectional views showing the progressive steps which are utilized in the formation of a semiconductor device incorporating the present invention in which junction isolation is utilized.
Figure 2:
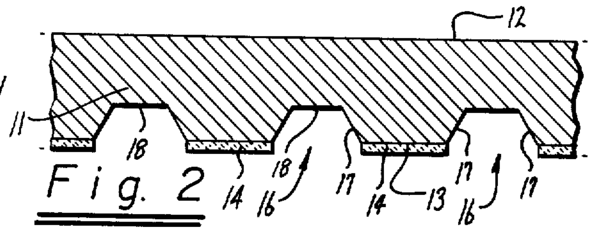

Moats 16 are provided in the body as shown in FIG. 2 and open through one surface as, for example, the surface 13. The moats 16 form a grid-like pattern which extends over the wafer being processed. The moats 16 are in the form of grooves or recesses in the body 11 and can be formed in any suitable manner. For example, they can be formed as disclosed in copending application Ser. No. 391,704, filed Aug. 24, 1964 which discloses that a layer 14 of silicon dioxide can be grown on the semiconductor body 11 so that at least the surface 13 is covered. Thereafter, a photoresist is applied to the silicon dioxide layer and exposed through a mask which contains a pattern for the moats 16. The photoresist is then developed and the unexposed portions are removed. Thereafter, a suitable etch such as a dilute solution of hydrofluoric acid is utilized to remove the silicon dioxide layer where it is exposed by the photoresist until the mono-crystalline semiconductor body 11 is exposed. Then utilizing the oxide layer 14 as a mask, the semiconductor body 11 is provided with the moats by another etch such as a mixture of hydrofluoric acid and nitric acid which preferentially attacks the silicon but not the silicon dioxide. This is continued until the moats 16 have been etched to the desired depth.

Alternatively, an anisotropic etch such as potassium hydroxide can be utilized to cut the moats 16 into the body 11. Typically, such an etch follows the crystal planes of the crystalline structure forming the body 11 so that the moats are provided with inclined side walls 17 as shown in FIG. 2. When silicon is etched in this manner, the side walls form an angle of 54.7° with the surface 13. This etching will continue until the side walls 17 meet each other to form a V or until the etch is removed. In the formation of the moats 16, the moats are etched to a predetermined depth as represented by the bottom walls 18 which is determined in part by the depth desired for the collector regions of the active circuit elements which are to be formed as hereinafter described.

As soon as the moats 16 have been completed, the insulating layer 14 is grown in the moats 16 by subjecting the semiconductor structure to an oxidizing atmosphere as a high temperature so that insulating layer 14 is continuous and extends into the moats 16 and covers the side walls 17 and the bottom walls 18 of the moats. Alternatively, if desired, the layer 14 can be completely removed after the formation of the moats 16 and the layer 14 completely regrown in an oxidizing atmosphere at an elevated temperature. Alternatively, the layer 14 can be formed of any suitable insulating material such as silicon nitride or aluminum oxide. The silicon oxide and the silicon nitride can be classified as being silicon compounds. Typically, the layer 14 should have a thickness of 1 to 3 microns to provide the desired isolation.

Figures 3, 4, 5:
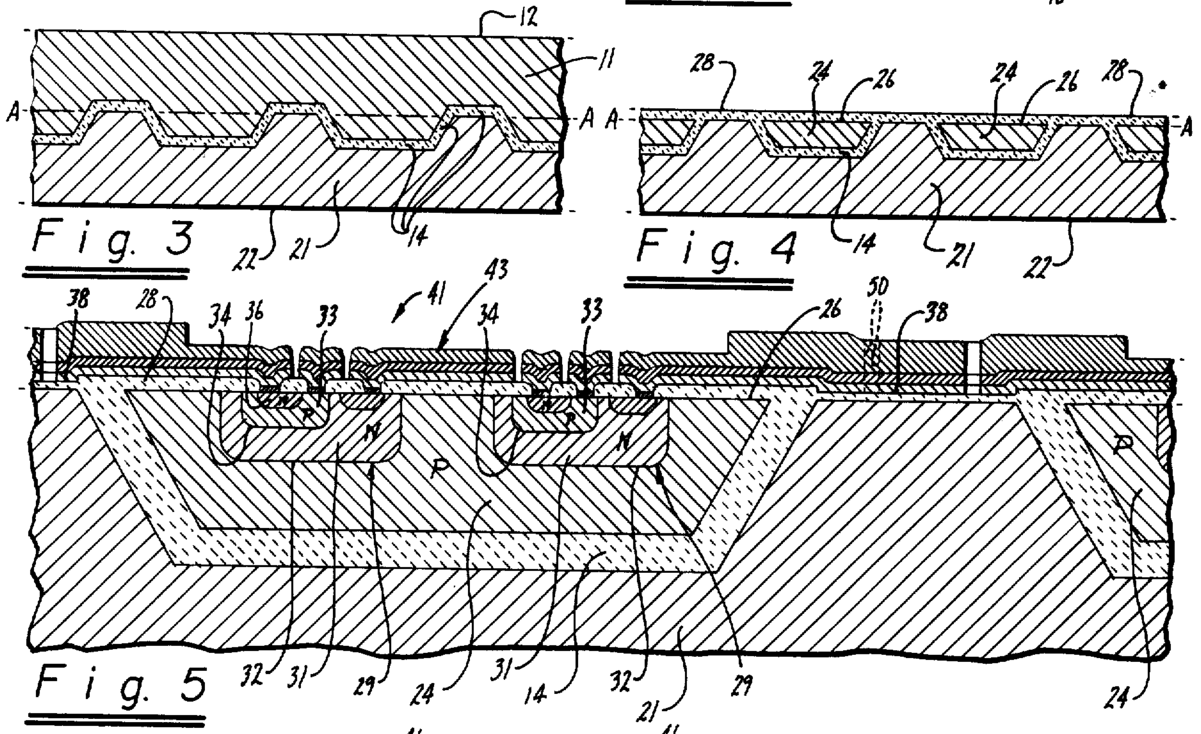

A support body 21 of a suitable material such as polycrystalline silicon as shown in FIG. 3 is grown on the layer 14 in the same manner as disclosed in copending application Ser. No. 391,704, filed Aug. 24, 1964. As disclosed therein, this polycrystalline body 21 can be deposited in an epitaxial reactor to a suitable depth such as 100 to 200 microns.

In the next step, the outer surface 22 of the support body 21 is ground flat so that it is parallel with the surface 12. Most of the silicon body 11 is then removed by first grinding away the silicon crystalline body in a plane generally parallel to the surface 12 close to the insulating layer 14 in the moats 16. Thereafter, the structure shown in FIG. 3 is polished until the moats are exposed and generally down to the dotted line indicated at A—A in FIG. 3. This provides islands 24 of the monocrystalline semiconductor material which form the body 11 which are dielectrically isolated from each other by the remaining portions of the insulating layer 14. As can be seen in FIG. 3, it is desirable to remove the portions of the insulating layer 14 which cover the bottom walls 18 of the moats 16 to expose the polycrystalline support body 21. In other words, the highest points of the oxide layer 14 are removed.

Islands 24 are provided with planar exposed surfaces 26. These surfaces 26, together with the entire exposed surface of the structure as shown in FIG. 4, are covered with a layer 28 of suitable insulating material such as silicon dioxide by placing the structure in an oxidizing atmosphere at an elevated temperature. Again, this oxide layer is grown to a suitable thickness such as 1 to 3 microns.

Thereafter, as shown in FIG. 5, at least one and preferably several active devices 29 are formed in each of the islands 24 in such a manner that the active devices within each island are isolated from each other by PN junctions. In addition, passive devices can be formed in the islands 24 as, for example, diffused resistors can be utilized. The formation of such devices is well known to those skilled in the art and utilizes conventional masking and diffusion techniques in which the formation of transistors is characterized as a triple diffusion process in which an N-type collector region 31 is formed by a dish-shaped PN junction 32 which extends to the surface 26. A P-type base region 33 is formed by a dish-shaped junction 34 which is offset but disposed within the dish-shaped junction 32 and extending to the surface 26 and an emitter region 36 formed by a dish-shaped junction within the junction 34 and extending to the surface 26. Thus, there has been provided transistors of the NPN type. If desired, transistors of the opposite type can be readily formed, as well known to those skilled in the art, by starting with a body 11 which is doped with an N-type impurity.

During the time that openings are being formed in the layer 28 for the emitter diffusion, the masking is such that the oxide overlying the moats 16 is removed. Thereafter, during the emitter diffusion, a very thin layer of oxide regrows in these regions overlying the moats 16 as indicated at 38 in FIGS. 5 and 6. Typically, this thin oxide layer can be approximately 1000 Angstroms in thickness.

If it is desired to utilize a beam lead sealed junction technology in connection with the manufacture of the semiconductor device and/or assembly, a beam lead construction 41 is formed by depositing a layer of silicon nitride on the silicon dioxide layer 28 as described in the Bell Laboratories Record for October/November 1966. This is followed by a thin layer of silicon dioxide which is deposited over the silicon nitride. Contact windows 42 are then opened through the oxide layer 28 or through the composite layer by suitable etching steps. After the contact windows 42 have been formed, beam leads 43 are applied over the silicon dioxide layer 28 and make contact to the collector, base and emitter regions 31, 33 and 36 of the active devices. As disclosed in this same Bell Laboratories Record, the beam leads are formed by sputtering platinum over the entire surface at an elevated temperature to form platinum silicide. The platinum over the oxide is then etched away leaving the inert platinum silicide contacts 44 in the windows 42. The beam leads 43 are formed by composite construction consisting first of a layer 46 of titanium which reacts with both silicon dioxide and silicon nitride forming a strong bond. Next, a layer 47 of platinum is provided and then finally an outer layer 48 of gold is provided. The layer of gold 48 is deposited at a lesser thickness over the major inner portions of the islands 24 and at a greater thickness at the outer extremities of the islands to provide the beam characteristics for the leads 43. The beam leads 43 are interdigitated as shown by dotted lines 50 in FIG. 5.

After the beam lead construction 41 has been completed, the top surface of the structure having the lead construction 41 thereon is turned upside down and waxed to a plate. Thereafter, the polycrystalline support body 21 is removed by the use of a suitable etch such as an etch which consists of a mixture of hydrofluoric, nitric, and acetic acids which attacks the polycrystalline silicon very rapidly but attacks the silicon dioxide at a very low rate. The silicon dioxide layer 14 serves as a stop for the etch. Since this is the case, this eliminates the neccessity for any masking for removal of the polycrystalline support body 21. In view of the fact that the insulating layer 28 at points 38 is very thin, hydrofluoric acid can be used to etch the thin layer of oxide from the back sides of the portions of the beam leads 43 immediately adjacent the edges of the islands 24 without removing the layer 14 surrounding the islands.

Figure 6:
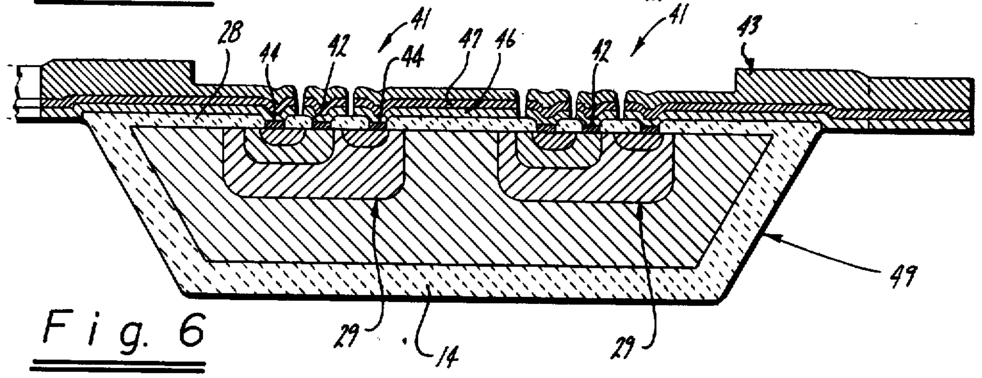

After the polycrystalline support body 21 and the oxide layer 28 on the back sides of the beam leads 43 have been removed, the devices which have been formed can be probed and die sorted while still waxed in position. After they have been probed and die sorted, they are separated into individual devices 49 as shown in FIG. 6.

Although in the drawings for simplicity purposes, only two active devices have been shown for each of the integrated circuits which have been formed, it should be appreciated that it is possible to provide a complete integrated circuit within each island consisting of active and passive devices in which the isolation between the components of the integrated circuit is provided by diffused junctions.

The devices, after they have been completed, can be bonded to some interconnection circuit as, for example, an interconnection circuit provided on a separated substrate by turning the devices upside down and bonding the beam leads to the interconnection circuit by thermocompression bonding or by ultrasonic bonding as described in Weissenstern et al. U.S. Patent No. 3,255,511. Since the beam leads 43 extend beyond the semiconductor body, they can be bonded individually or a bonding tool can be provided so that all of the leads are bonded in a single operation.

It can be seen that when such a construction is provided that each device 29 is isolated from another device 29 by the PN junctions 32 formed by the P-type impurity of the body and the N-type collector regions. The body or island 24 in which the integrated circuit is formed is completely encapsulated within an insulating layer formed by the silicon dioxide layer 14 and the layer 28 provided on the top surface of the island 26. Since this silicon dioxide layer has been thermally grown, it is very compatible with the other materials which are utilized for the device and which can readily assimilate the various steps which are required in the production of the device. This outer layer 14 serves to protect the silicon islands 24 from the atmosphere and also from moisture. In addition, it helps to prevent any shorts from occurring from the beam leads 43 to the island.

In the operation of the integrated circuits, the desired isolation between the elements forming the circuit are provided by reverse biasing of the junctions in a manner well known to those skilled in the art.

Figure 7:
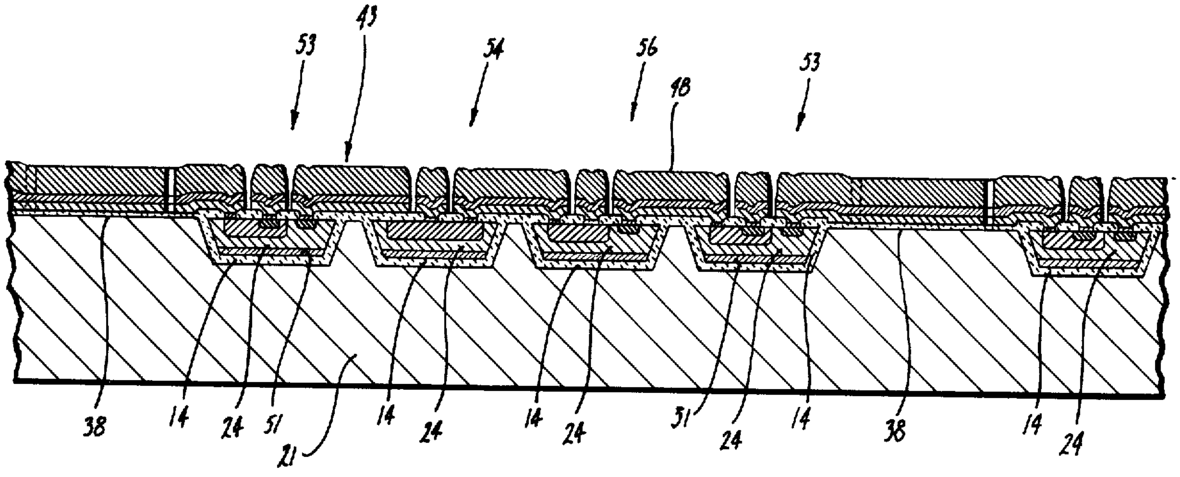
FIGS. 7 and 8 are cross-sectional views which show certain steps in the method utilized in making semiconductor device and assembly incorporating the present invention utilizing air isolation.
Figure 8:
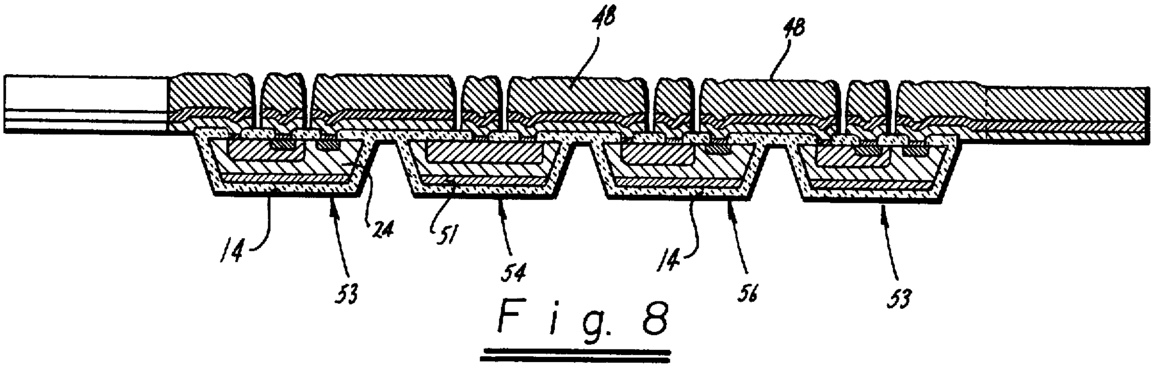

The method for making a semiconductor device and/or assembly utilizing air isolation is shown in FIGS. 7 and 8. The initial steps are generally identical to those hereinbefore described through the construction which is shown in FIGS. 1–4 with the exception that an N+ layer 51 may be provided as hereinafter described in conjunction with FIGS. 13 and 14 to serve as a collector shunt to reduce collector resistance. The process, however, differs in that the body 11 is doped with an N-type impurity and the N+ layer 51 is formed. Thereafter, the active devices are formed by a double diffusion process well known to those skilled in the art. As shown in FIG. 7, in the application of the beam lead construction, the titanium-platinum-gold system is still utilized. However, the gold layer 48, rather than being applied in different thicknesses, is applied at the same thickness throughout. This is done so that the beam leads 43 will have sufficient strength to provide support for the individual transistors, diodes and resistor islands which form an integrated circuit.

With the construction shown in FIG. 7, the devices would function as dielectrically isolated integrated circuits. However, it can be seen that the back sides of the beam leads 43 are not exposed and, therefore, it will be difficult to interconnect such a construction to an interconnection board utilizing upside down or face bonding because it is difficult to make contact with the back sides of the leads 43.

In order to obtain access to the back sides of the leads 43, the polycrystalline support body 21 is removed by the use of an etch hereinbefore described. This etch removes all the polycrystalline material and, in addition, removes the thin portions of the oxide at 38 on the back sides of the leads 43 to provide the construction which is shown in FIG. 8. In this embodiment of the invention the discrete devices, such as the transistors 53, the diffused resistor 54, and the diode 56 are insulated or isolated from each other by air. The thick beam leads provide the support for retaining the discrete elements in operative integrated circuits. The integrated circuit can then be turned upside down or face bonded to a substrate carrying interconnecting leads by the use of thermocompression bonding or ultrasonic bonding as hereinbefore described. In this embodiment it can be seen that the silicon bodies which are utilized for forming the discrete devices are encapsulated in a silicon dioxide layer 14 which completely encloses the bottom sides and makes contact with the bottom sides of the portions of the beam leads 43 adjacent the islands or bodies 24.

Figure 9:
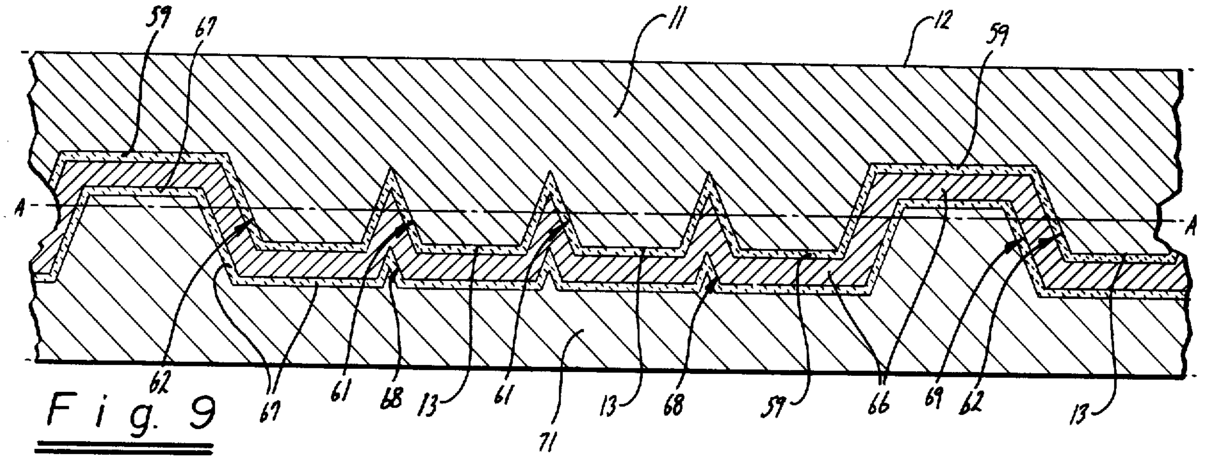
FIGS. 9 through 11 are cross-sectional views showing certain steps in the method which is utilized for making a semiconductor device and incorporating the present invention utilizing dielectric isolation.
Figure 10:
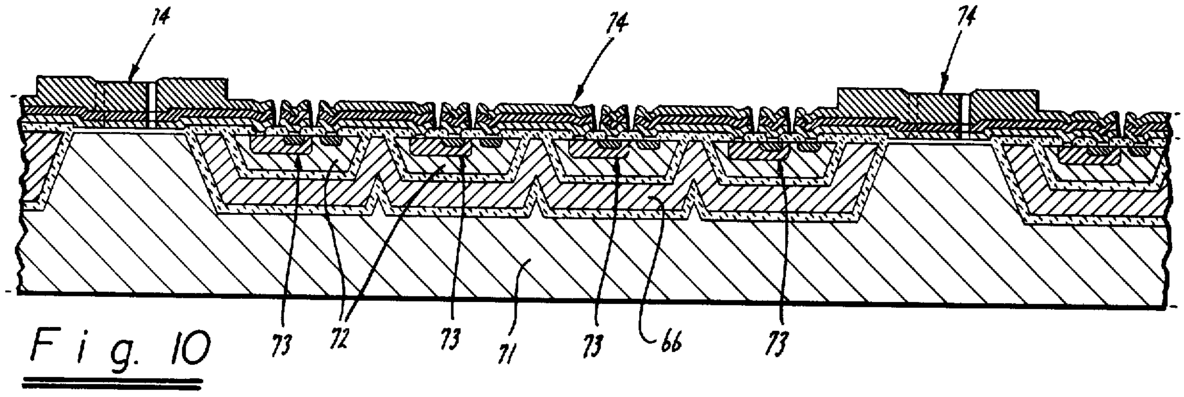
Figure 11:
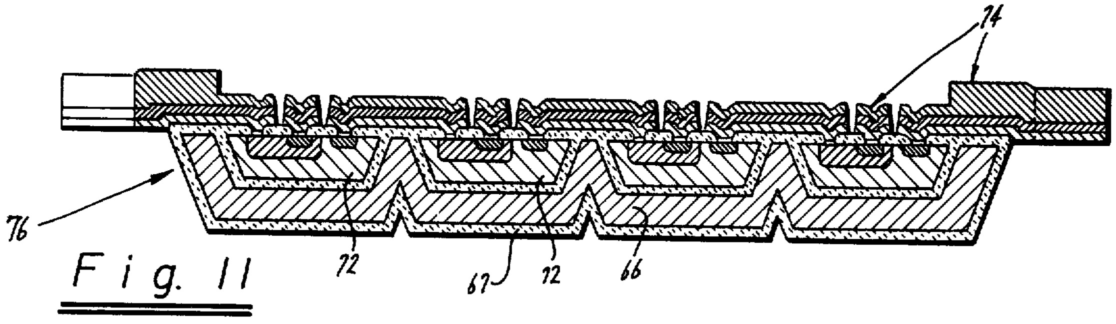
Figure 12:
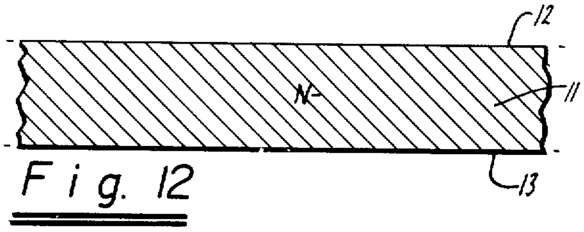
FIGS. 12 through 19 are cross-sectional views showing certain steps in the method utilized in making a semiconductor device and assembly having epitaxially grown portions.

The method for making another embodiment of the semicondictor device and/or assembly utilizing dielectric isolation is shown in FIGS. 9–11. In this embodiment, the method is started with an N-type body 11 and a layer 14 of insulating material of silicon dioxide is formed on the surface 13 as shown in FIG. 2. Moats 61 and 62 are formed in the body 11 in much the same manner as hereinbefore described in connection with the previous embodiments. However, the moats 61 and 62 are of two different types. The moats 61 are relatively narrow and are V-shaped and go to a depth which is only slightly greater than the desired collector thickness for the devices which are to be utilized. The moats 62, on the other hand, are much wider and go to a greater depth and are provided for separating integrated circuits from each other. Thus, the shallower moats 61 are utilized for isolating the circuit elements which make up an integrated circuit, whereas the larger moats 62 are utilized for separating the integrated circuits from each other.

The moats 61 and 62 are formed by providing a pattern on the oxide layer 14 which is relatively narrow for the moats 61 and which is relatively wide for the moats 62. Thus, when windows are opened in the silicon oxide layer 14, and the silicon forming the body 11 is exposed to an anisotropic etch of the type hereinbefore described, etching continues in the narrow openings until V-shaped recesses are provided which form the moats 61. The etching continues in the wider openings until the moats 62 have been etched to a considerably greater depth and thereafter the etch is removed. Typically, the moats 61 can have a depth of approximately 1 mil, whereas the moats 62 can have a depth of 3 – 6 mils.

After the moats 61 and 62 have been etched, the remaining oxide 14 is stripped and the wafer which forms the body 11 is oxidized in the manner hereinbefore described to provide a continuous oxide layer 59 which covers the side walls of the moats 61 and 62 and the bottom walls of the moats 62. As soon as the body or wafer 11 has been oxidized, a layer 66 of a suitable material such as polycrystalline silicon is grown over the oxide layer 59. It is desirable that the layer 66 be of a thickness so that it can provide a support for the individual islands in the device which is to be formed but which is not thick enough to fill the moats 61 and 62. By way of example, this layer 66 can have a thickness of approximately 2 – 4 mils.

As soon as the layer 66 has been formed, another layer 67 of silicon dioxide is formed on the layer 66 and covers the side walls which form the moats 68 and the side walls and the bottom walls which form the moats 69 in the layer 66. Thus, the layer 67 is a layer of insulating material which is generally of the same thickness as the layer of insulating material 59 but is spaced from the layer 59 by the layer 66. After the layer 67 has been formed, another layer 71 of a suitable support material, such as polycrystalline silicon, is formed on the layer 67.

In practice, the layers 66, 67 and 71 can be readily formed in an epitaxial reactor by first growing the polycrystalline layer 66, the silicon dioxide layer 67 and the polycrystalline layer 71.

Thereafter, the composite body is lapped back as hereinbefore previously described to a point which is on the line A—A in FIG. 9 until sufficient material has been lapped away to remove the upper portions of the oxide layer 59 grown in the moats 61 but which has been cut to a depth to cut through the oxide layers 59 and 67 in the large moats 62.

As can be seen from FIGS. 10 and 11, a plurality of isolated islands 72 are formed in this manner which are dielectrically isolated from each other by the insulating layer 59. Thereafter, the elements or devices 73 which make up the integrated circuit are formed within the islands 72 in the manner hereinbefore described. Thus, there can be provided transistors, diodes, diffused resistors and the like which are required to make up for the integrated circuit. After the circuit elements 73 have been formed, an interdigitated beam lead construction 74 of the general type as shown in FIG. 5 is provided.

After completion of the beam lead construction 74, the polycrystalline support body 71 is removed by an etch as hereinbefore described. The layer 67 of silicon dioxide serves as a stop to prevent the etch from attacking the polycrystalline layer 66 and also to prevent the etch from separating the individual elements or devices 73 which make up the integrated circuit 76. However, since there is no such stop within the moats 69, the polycrystalline material is removed and, in addition, the very thin layer of silicon dioxide underlying the beam lead construction 74 is removed to provide separate discrete integrated circuits 76 such as shown in FIG. 11 in which the circuit elements making up the circuit are isolated from each other dielectrically by the insulating layer 59. The silicon bodies in which the circuit elements of the integrated circuit device are formed are completely encapsulated by the insulating layer 59 and are isolated from the beam lead construction 74 so that shorts are prevented.

Another method for making another embodiment of the semiconductor device and/or assembly utilizing dielectric isolation is shown in FIGS. 12–18. As shown, the method is started with a semiconductor body 11 of the N- type. A layer 81 of a higher conductivity type semiconductor material, such as N+, is grown on or diffused into the entire surface 13 or on selective portions thereof if desired by suitable means in a manner well known to those skilled in the art. Thereafter, isolation moats 82 are formed in the body 11 in much the same manner as hereinbefore described in connection with the previous embodiments and as set forth below.

Figure 13:
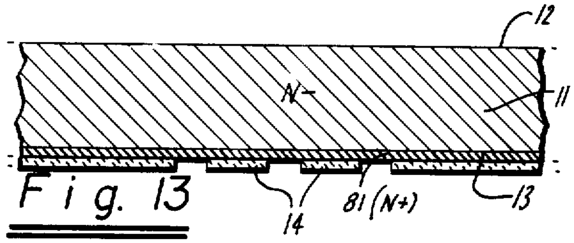
Figure 14:
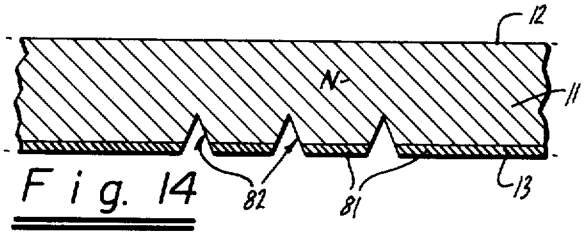

As described in connection with the previous embodiments, the structure shown in FIG. 13 is subjected to an oxidizing atmosphere at a high temperature to form an insulating layer 14 of silicon dioxide which is continuous and so at least the N+ layer 81 is covered by the insulating layer. Thereafter, a photoresist is applied to the silicon dioxide layer and is exposed through a mask which contains a pattern for the moats 82. The photoresist is then developed and the unexposed portions are removed. Etch is then applied to remove the silicon dioxide layer where it is exposed by the photoresist until the N+ layer 81 is exposed. Another etch is then utilized to form the moats 82 by selectively attacking the N+ layer 81 and the body 11 underlying the openings to form the V-shaped moats 82. Thereafter, the silicon dioxide and insulating layer is stripped away with a suitable etch to provide the structure which is shown in FIG. 14.

Figure 15:
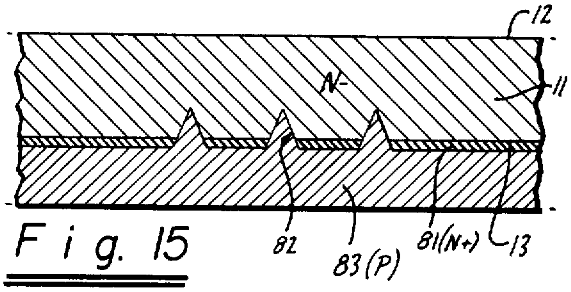
Figure 16:
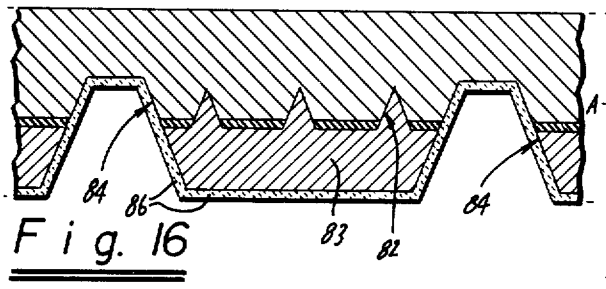

Thereafter, as shown in FIG. 15, another layer 83 of a suitable semiconductor material such as P type semiconductor material is formed on the N+ layer 81 and in the moats 82. This can be accomplished in any suitable manner as, for example, in an epitaxial reactor. The layer 83 may have any suitable thickness such as approximately 2 – 4 mils. It should be thick enough to provide a support for the isolated islands as hereinafter described. The structure shown in FIG. 15 is then placed in an oxidizing atmosphere at high temperature to provide an insulating layer of silicon dioxide which surrounds the body and at least covers the exposed surface of the P type layer 83. Photoresist is then applied to the oxide layer and developed. The portions of the oxide layer which are exposed are etched away and thereafter the etch is utilized to etch additional larger moats 84 through the P type layer 83, through the N+ layer 81 and into the body 11 to a depth which is greater than the depth of the moats 82 as described in a previous embodiment. The moats 84 are substantially wider than the moats 82 and serve as dicing lines in the wafer. After the etching of the larger moats 84 has been completed, the remaining silicon dioxide is stripped and then the oxide layer is completely regrown by placing the semiconductor structure in an oxidizing atmosphere at high temperature to provide an oxide layer 86 which surrounds the entire body and which at least should cover the P type layer 83 and the side walls and bottom walls of the larger moats 84.

Figure 17:
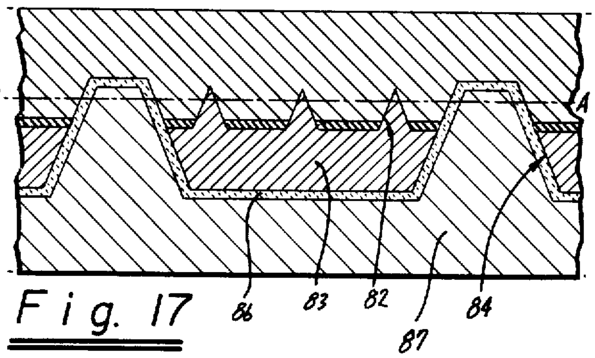

As soon as the foregoing steps have been completed, and additional layer 87 of polycrystalline silicon is grown on the layer 86 so that it completely fills up the larger moats 84 and deposits a relatively thick layer of the material over the oxide layer 86 as shown in FIG. 17. The structure shown in FIG. 17 is then placed in a lapping machine and the upper portion of the body 11 is removed down to the dotted line A—A shown in FIG. 17, through the oxide layer in the moats 84 and through the moats 82. The lapped surface is then polished to the final depth and thereafter an insulating layer 88, such as silicon dioxide, is grown on the polished surface as, for example, by placing the structure in an oxidizing atmosphere at a high temperature.

Figures 18, 19:
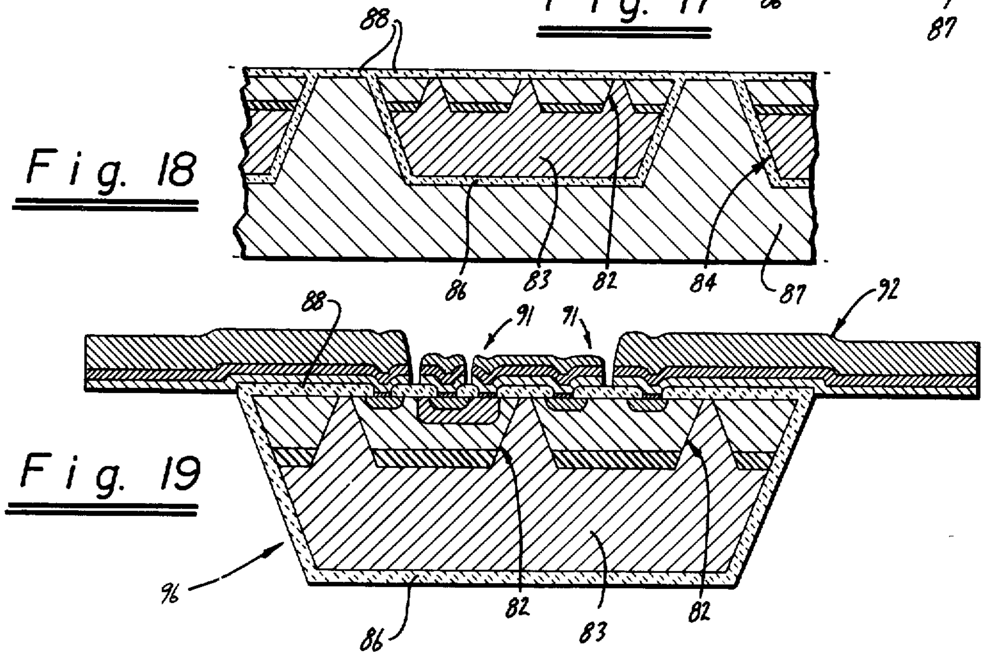

As soon as these steps have been completed, semiconductor devices 91 of the type hereinbefore described are provided in the N− islands 11 of semiconductor material to form typical semiconductor circuit elements such as transistors, diodes, resistors and the like. For example, as shown in FIG. 19, a transistor and a resistor are shown. A beam lead construction 92 is provided for interconnecting the devices in a manner identical to that hereinbefore described in which the beam lead construction is provided with thin portions and relatively thick portions as shown in the drawing in FIG. 19. As soon as the beam lead construction has been completed, the polycrystalline layer 87 is removed. In addition, the very thin layer of silicon dioxide underlying the beam lead construction is removed to provide separate discrete integrated circuits 96 such as that shown in FIG. 19. With these integrated circuits, the devices are isolated from each other by PN junctions. In addition, it can be seen that the devices have been provided with an N+ layer which as, for example, in a transistor serves as a collector shunt in a manner well known to those skilled in the art.

Figure 20:
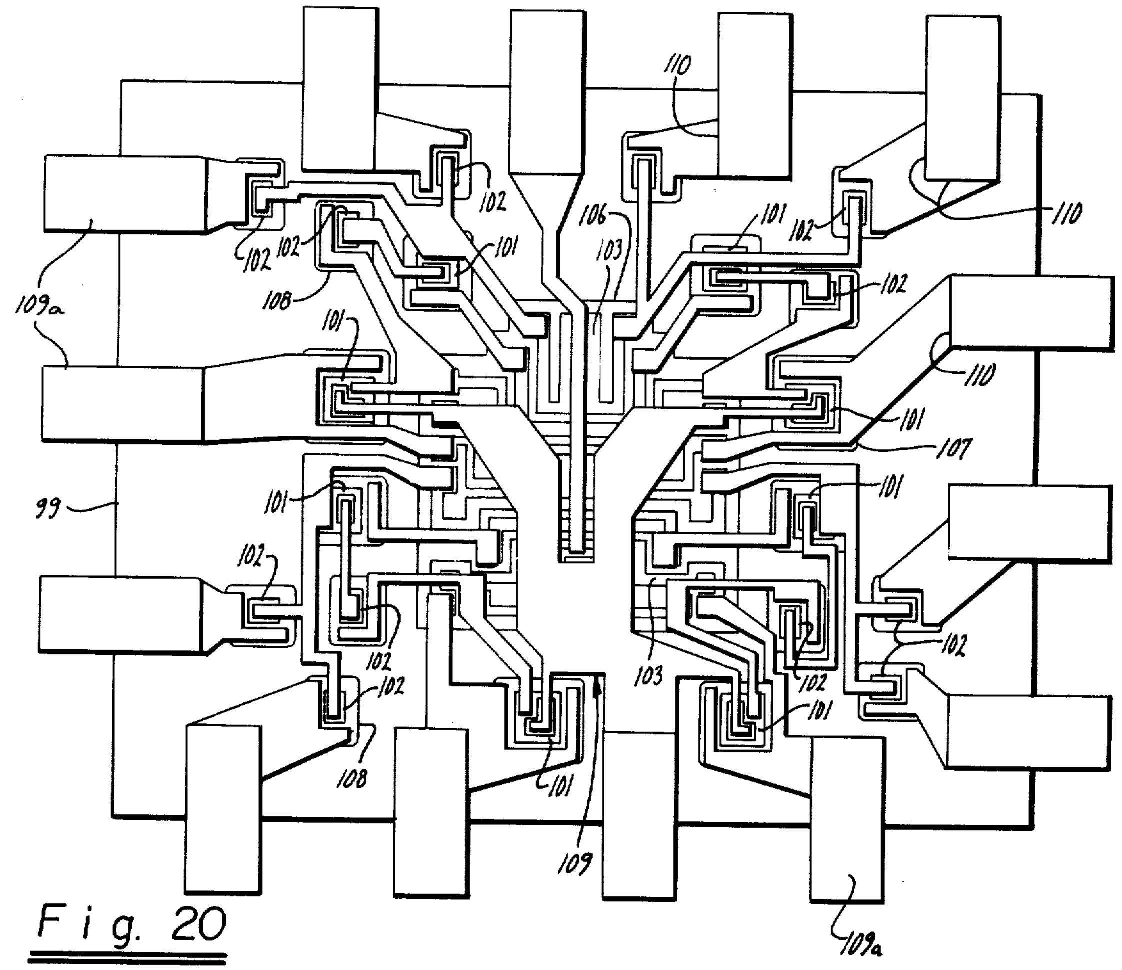
FIG. 20 is a plan view of a typical semiconductor device utilizing the encapsulated beam lead construction incorporating the present invention.

In FIG. 20 there is shown a plan view of a typical encapsulated beam lead construction for a semiconductor device and assembly incorporating the present invention and shows a circuit which can be characterized as a quad dual input gate that has been identified as a Type SE-180 manufactured by Signetics Corporation. It consists of a single monolithic body 99 which has formed therein eight transistors 101, 12 diodes 102 and 16 resistors 103. The resistors 103 are provided in a single collector bed 106, whereas the transistors are formed in a plurality of collector beds 107 and the diodes are formed in a plurality of collector beds 108. The devices are isolated from each other by PN junctions in the manner shown in FIG. 5. A beam lead construction 109 of the type shown in FIGS. 5 and 6 is formed on the body 99 and includes thick terminal beam lead portions 109*a* as shown by the solid lines 110. The entire back side of the body 99 is encapsulated in suitable insulating material such as silicon dioxide to in effect encapsulate the beam leads as hereinbefore described in conjunction with the embodiment shown in FIGS. 5 and 6.

From FIG. 20 it can be seen that complete integrated circuits can be provided utilizing encapsulated beam leads and in which isolation can be obtained, either by PN junction isolation or by dielectric or air isolation.

Figure 21:
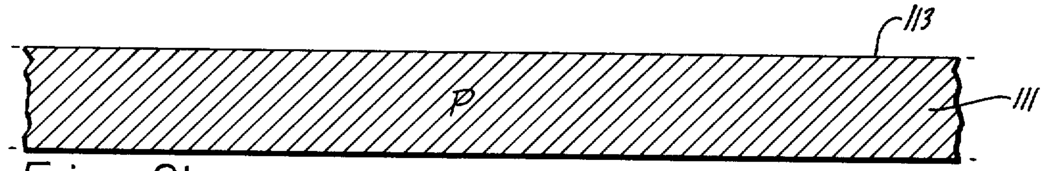
FIGS. 21 through 30 are cross-sectional views showing certain steps in the method utilized in making a semiconductor device and assembly.
Figure 22:
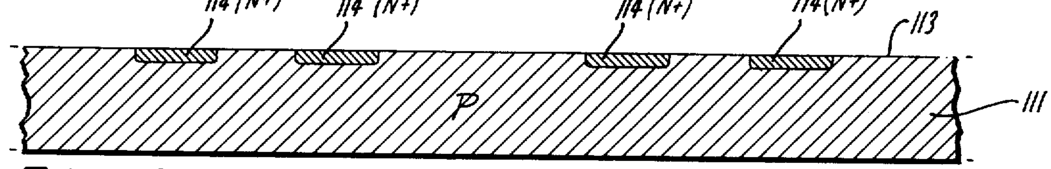
Figure 23:
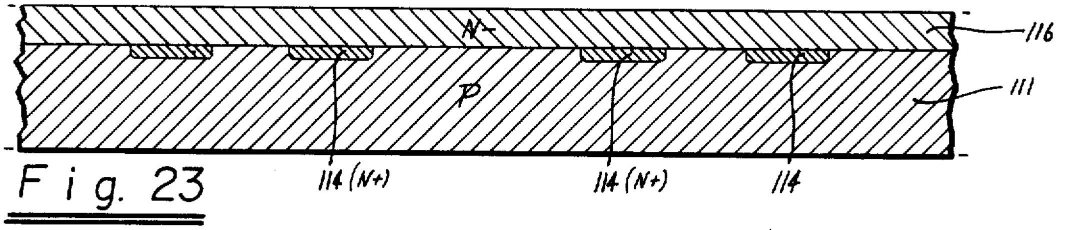
Figure 24:
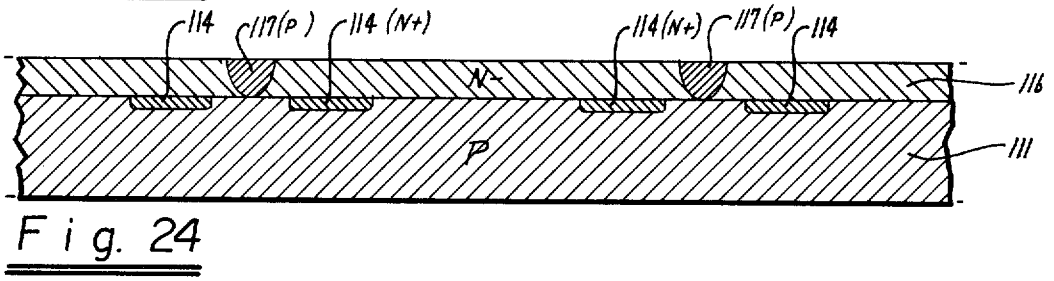

Still another method for making another embodiment of the semiconductor device and/or assembly utilizing PN junction isolation is shown in FIGS. 21–30. As shown in FIG. 21, the method is started by taking a semiconductor body 111 of the P type as described in conjunction with the previous embodiments; a silicon dioxide layer is provided on the surface 113 which is masked and etched to provide holes through which arsenic is diffused to provide N+ regions 114, as shown in FIG. 22. Thereafter, the oxide is stripped by a suitable etch. Thereafter, as shown in FIG. 23, a layer 116 is formed on the surface 113 and overlying the diffused N+ regions 114 such as by depositing material of an N− type in an epitaxial reactor to provide the layer 116. Thereafter, the structure which is shown in FIG. 23 is placed in an oxidizing atmosphere to grow an oxide layer around the same. It is masked and holes etched into the mask and a P type impurity is diffused through the holes to provide P type regions 117 which extend through the layer 116 so that they at least come into contact with the surface 113 of the body 111 or extend through the same in areas between the N+ regions 114. The isolation regions 117 are positioned so that discrete devices can be formed between the same as hereinafter described.

Figure 25:
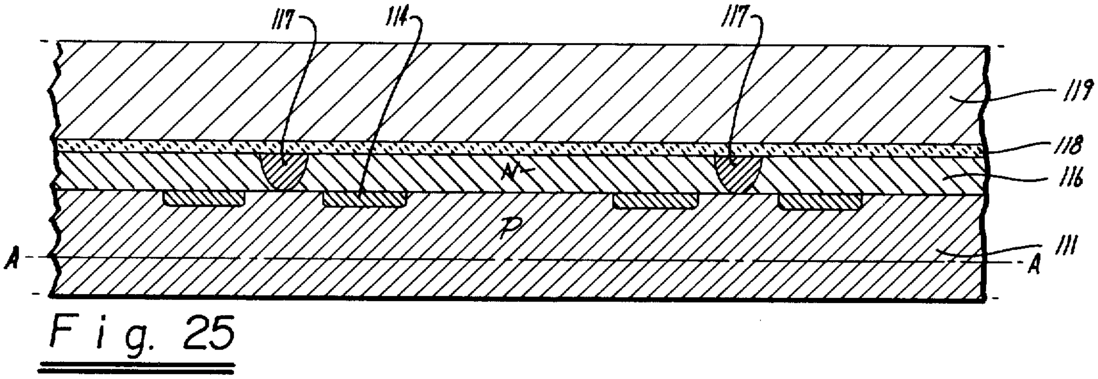
Figure 26:
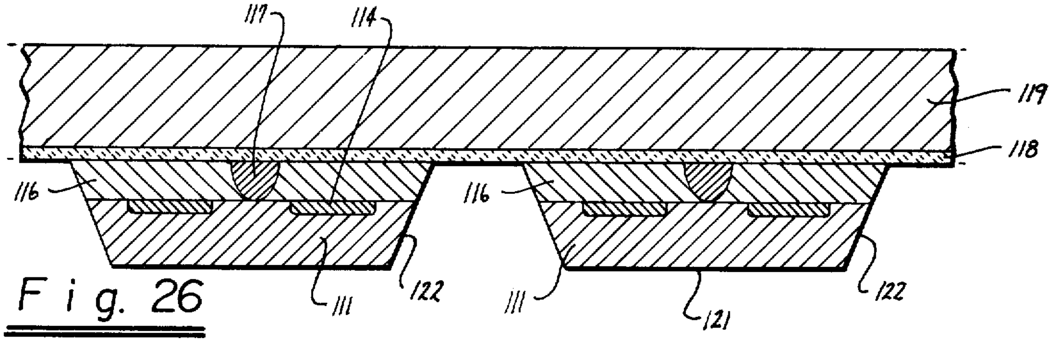
Figure 27:
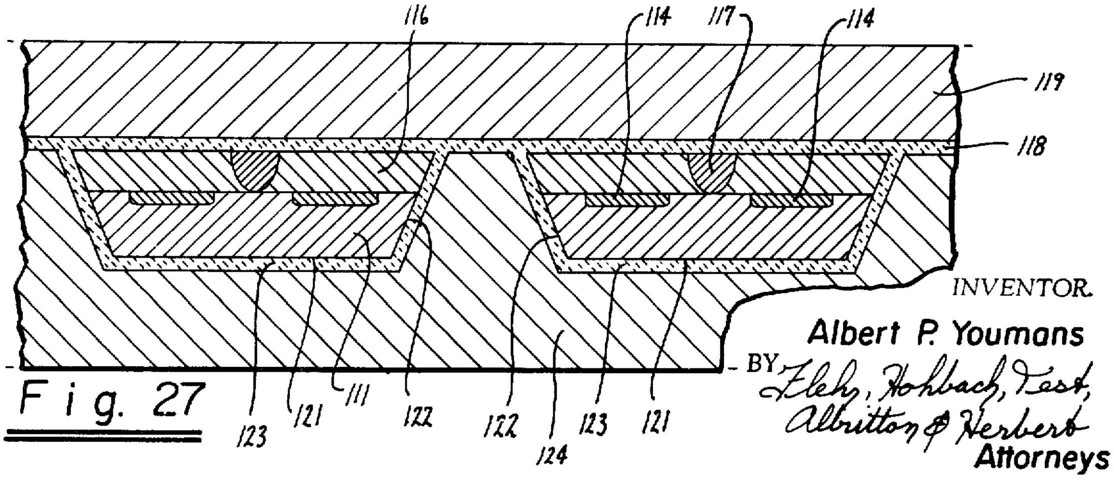

After the diffused regions 117 have been formed, the oxide is again stripped and then regrown to provide an oxide layer 118 which overlies the layer 116 and covers the diffused regions 117. A layer 119 is then grown over the layer 118 to provide a support. Typically, this layer can be formed of a polycrystalline silicon deposited in an epitaxial reactor. The body 111 is then lapped to provide a relatively thin layer to a plane which is generally in line with the dotted line A—A as shown in FIG. 25 to provide a surface 121 which is generally parallel to the surface 113. An oxide layer is then grown on the back surface 121. It is masked to provide openings and the material exposed in the openings is etched away to provide V-shaped separation moats 122 which extend down to the silicon dioxide layer 118.

The surfaces 121 and the surfaces forming the moats 122 are covered with thin layers 123 of a suitable insulating material such as silicon dioxide, silicon nitride or aluminum oxide as hereinbefore described to provide the encapsulation for the semiconductor devices.

Figure 28:
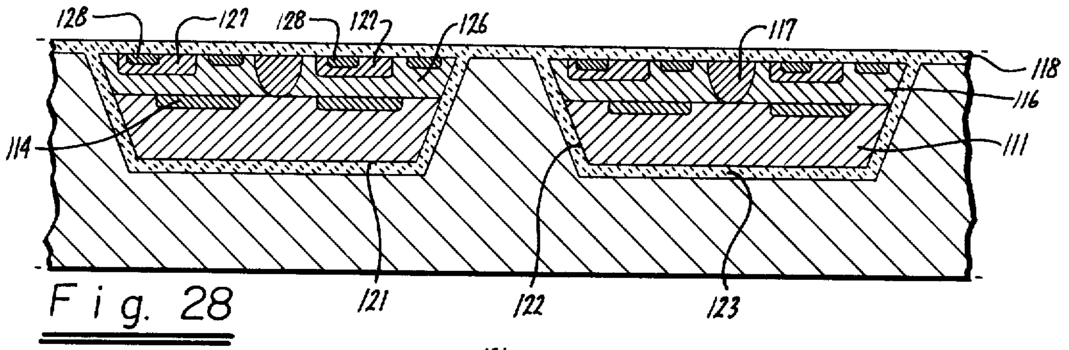

As soon as the layers 123 have been provided, a support 124 is deposited upon the layers 123 such as by depositing polycrystalline silicon to fill the remaining spaces in the moats 122 and to cover the layers 123. Thereafter, the first polycrystalline support structure 119 is removed by suitable means such as by an etch to expose the oxide layer 118. Thereafter, in a conventional manner, openings are formed in the layer 118 for the base and emitter diffusions. Thus, as shown in FIG. 28, there is provided a plurality of transistors each consisting of a collector region 126, a base region 127 and emitter region 128 to provide separate transistors in which the transistors are isolated from each other either by a pair of diffused regions 117 or by one of the diffused regions 117 and the layer 121. In addition, each of the transistors is provided with an N+ bed 114 which serves as a collector shunt.

Figure 29:
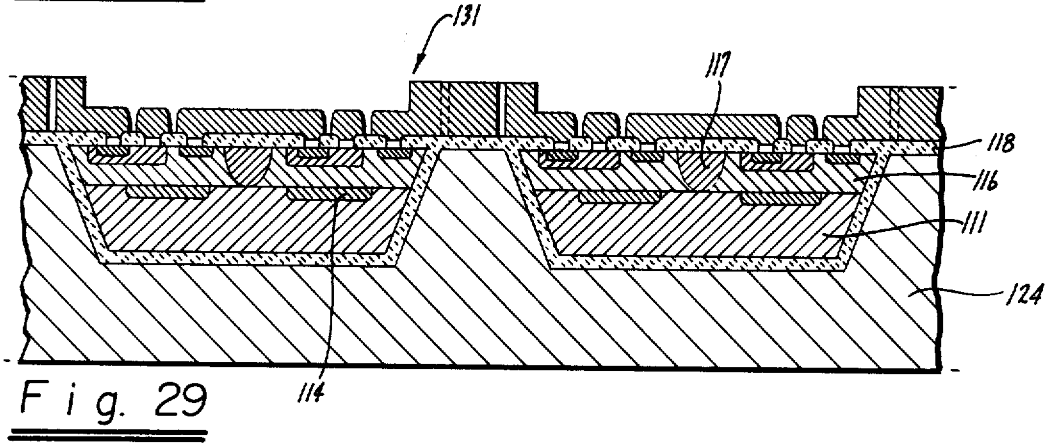
Figure 30:
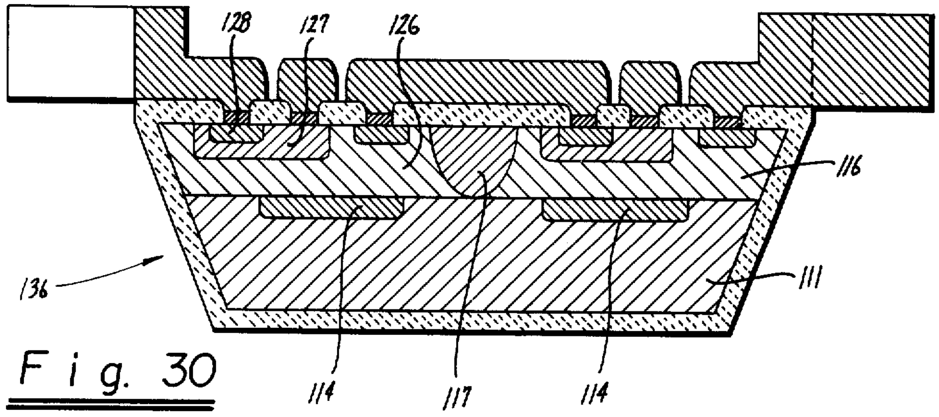

Thereafter, as shown in FIG. 29, an interdigitated beam lead construction 131 is provided of the type hereinbefore described in conjunction with FIGS. 5 and 6. After the beam lead construction has been completed, the polycrystalline support material 124 is etched away to provide separate devices 136 as shown in FIG. 30 in which a complete integrated circuit of the epitaxial type can be provided incorporating the present invention and utilizing diffused regions to obtain the isolation between the devices.

From the foregoing, it can be seen that the present invention is adapted for use with conventional planar type devices of all types. As can be seen from the various embodiments, the invention can also be applied to junction isolation, air isolation and dielectric isolation of the circuit elements which form part of the circuit.

Although the devices formed can be complete integrated circuits themselves, it should be appreciated that a plurality of the integrated circuits can be interconnected by turning them upside down and bonding them to an interconnect pattern provided on a separate substrate to interconnect the same to provide a relatively compact semiconductor assembly.

In all the embodiments, the monocrystalline bodies in which the circuit elements are formed are completely encapsulated and, in addition, they are protected from shorts occurring between the leads and the monocrystalline bodies.

I claim:

1. In a semiconductor device, a body of semiconductor material having a planar upper surface, a bottom surface and side wall surfaces, at least one active circuit element formed in said body by junctions which extend to said surface, a layer of insulating material carried by the body and overlying said upper surface, lead means carried by the body and extending through said layer of insulating material and making contact with the active circuit element and extending from the body and having outer ends free of the body and the layer of insulating material, an additional continuous layer of insulating material in intimate contact with the bottom surface and the side wall surfaces of said body and in intimate contact with said first named layer of insulating material to encapsulate said body, said additional layer of insulating material and said first named layer of insulating material in combination being in intimate contact with said lead means exclusively on the bottom surfaces thereof in the regions where said lead means extend from the body whereby said additional layer of insulating material provides additional support for said first named layer of insulating material to prevent breaking of said first named layer of insulating material and to thereby prevent said lead means from coming in contact with the body in the regions where said lead means extend from the body, said additional layer of insulating material being surrounded by air.

2. A device as in claim 1 wherein said body is formed of monocrystalline silicon and wherein said additional and first named layers of insulating material are comprised of essentially a silicon compound.

3. A device as in claim 1 wherein a plurality of circuit elements are provided in the body and wherein said circuit elements are isolated from each other within the body by diffused junctions formed in the body between the circuit elements.

4. A device as in claim 1 wherein a plurality of circuit elements are provided in the body and wherein said circuit elements are isolated from each other by insulating material.

5. A device as in claim 1 wherein a plurality of circuit elements are provided in the body and wherein said circuit elements are isolated from each other.

6. A device as in claim 1 wherein said body is of one conductivity type and wherein the active circuit element has a buried layer in the body of higher conductivity than the body.

7. In a semiconductor assembly, a plurality of circuit elements, at least one body of semiconductor material having a planar surface in which the circuit elements are formed, at least certain of the circuit elements being formed by PN junctions in the body extending to said surface, a layer of insulating material in contact with said surface and overlying said surface, leads mounted on said body extending through said layer of insulating material and connected to the circuit element in said body, said leads extending beyond the body and said layer of insulating material so that the outer extremities are free of the body, and an additional continuous layer of insulating material encapsulating said body and making contact with said first named layer so that said first named and additional layers in combination enclose said body and make contact with said leads exclusively adjacent only portions of the bottom surfaces of said leads at the points where the leads extend beyond the body, said additional layer of insulating material providing additional support to said first named layer to prevent breaking of the first named layer of insulating material to thereby prevent the leads from coming into contact with the body at said points.

8. An assembly as in claim 7 wherein said circuit elements in each semiconductor body are isolated from each other.

9. An assembly as in claim 7 wherein a plurality of semiconductor bodies are provided with at least one circuit element formed in each of the bodies and wherein each of the bodies is provided with a layer of insulating material encapsulating the same, said bodies being interconnected by said lead means whereby said lead means serves as the principal means for supporting the bodies and retaining them in a unitary assembly.

10. An assembly as in claim 7 wherein a plurality of said semiconductor bodies are provided and wherein at least one circuit element is provided in each of said semiconductor bodies together with means formed of an insulating material disposed between the bodies and serving to join the bodies into a unitary construction so that the semiconductor bodies and the circuit elements contained therein are isolate dielectrically from each other.

11. An assembly as in claim 7 wherein said leads have relatively thin portions connected to the circuit elements and relatively thick portions extending beyond the body.

12. An assembly as in claim 7 wherein the circuit elements are isolated from each other by diffused regions in the semiconductor body.

* * * * *